(12) United States Patent
Lee et al.

(10) Patent No.: US 12,156,445 B2
(45) Date of Patent: Nov. 26, 2024

(54) FLEXIBLE DISPLAY DEVICE AND MANUFACTURING METHOD THEREOF

(71) Applicant: SAMSUNG DISPLAY CO., LTD., Yongin-si (KR)

(72) Inventors: Jae Been Lee, Seoul (KR); Yi Joon Ahn, Seoul (KR); Jun Woo You, Seongnam-si (KR); Tae Ho Lee, Gyeonggi-Do (KR); Dae Hwan Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 315 days.

(21) Appl. No.: 17/465,515

(22) Filed: Sep. 2, 2021

(65) Prior Publication Data

US 2022/0216289 A1 Jul. 7, 2022

(30) Foreign Application Priority Data

Jan. 6, 2021 (KR) ........................ 10-2021-0001646

(51) Int. Cl.
*H10K 59/131* (2023.01)
*B32B 3/30* (2006.01)
(Continued)

(52) U.S. Cl.
CPC ............. *H10K 59/131* (2023.02); *B32B 3/30* (2013.01); *B32B 7/12* (2013.01); *B32B 27/08* (2013.01);
(Continued)

(58) Field of Classification Search
CPC .... H10K 59/131; H10K 50/844; H10K 59/40; H10K 59/65; H10K 71/00; H10K 77/111; H10K 59/1201; H10K 2102/311; H10K 59/18; H10K 59/121; H10K 59/10; H10K 59/129; B32B 3/30; B32B 7/12; B32B 27/08; B32B 27/281; B32B 2457/20; B32B 2255/20; B32B 2307/206; B32B 3/266; B32B 9/00; B32B 2255/10; B32B 2307/546; B32B 9/04; B32B 15/08;
(Continued)

(56) References Cited

U.S. PATENT DOCUMENTS

2016/0141551 A1* 5/2016 Seo ..................... H10K 50/8445
257/40
2017/0257939 A1* 9/2017 Sano ..................... H05K 1/028
(Continued)

FOREIGN PATENT DOCUMENTS

| CN | 109844963 | 6/2019 |
|---|---|---|
| KR | 1020150074453 | 7/2015 |
| KR | 1020190079066 | 7/2019 |

*Primary Examiner* — J. E. Schoenholtz
(74) *Attorney, Agent, or Firm* — F. Chau & Associates, LLC

(57) ABSTRACT

A flexible display device includes a first flexible substrate that includes a signal line formed on one side of the first flexible substrate. A second flexible substrate is disposed on a second side of the first flexible substrate that is located opposite to the first side of the first flexible substrate. An opening penetrates the first flexible substrate and the second flexible substrate. A driver is attached to the second flexible substrate. A connection portion electrically connects the driver and the signal line to each other through the opening.

20 Claims, 21 Drawing Sheets

(51) Int. Cl.
*B32B 7/12* (2006.01)
*B32B 27/08* (2006.01)
*B32B 27/28* (2006.01)
*H10K 50/844* (2023.01)
*H10K 59/12* (2023.01)
*H10K 59/40* (2023.01)
*H10K 59/65* (2023.01)
*H10K 71/00* (2023.01)
*H10K 77/10* (2023.01)
*H10K 102/00* (2023.01)

(52) U.S. Cl.
CPC ......... *B32B 27/281* (2013.01); *H10K 50/844* (2023.02); *H10K 59/40* (2023.02); *H10K 59/65* (2023.02); *H10K 71/00* (2023.02); *H10K 77/111* (2023.02); *B32B 2457/20* (2013.01); *H10K 59/1201* (2023.02); *H10K 2102/311* (2023.02)

(58) Field of Classification Search
CPC . B32B 27/06; G09F 9/301; G09F 9/33; G09F 9/3023; H05K 1/147
See application file for complete search history.

(56) References Cited

U.S. PATENT DOCUMENTS

| | | | | |
|---|---|---|---|---|
| 2018/0095582 A1* | 4/2018 | Hwang | ............... | H10K 59/40 |
| 2018/0151641 A1* | 5/2018 | Choo | ............... | G06F 1/1684 |
| 2019/0393278 A1* | 12/2019 | Wu | ............... | H10K 59/12 |
| 2020/0258967 A1* | 8/2020 | Kim | ............... | H10K 59/17 |
| 2021/0405688 A1* | 12/2021 | Barrett | ............... | G06F 1/1637 |

\* cited by examiner

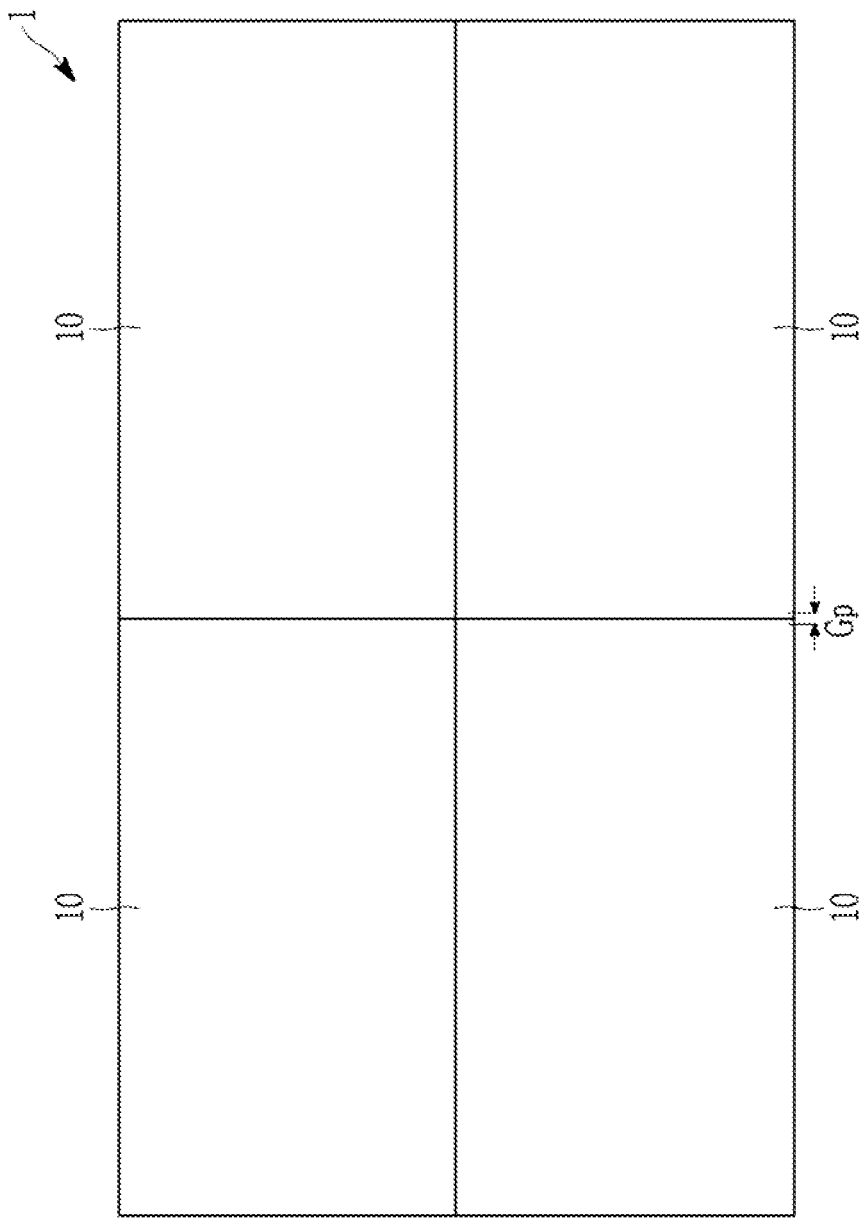

FLEXIBLE DISPLAY DEVICE AND MANUFACTURING METHOD THEREOF

CROSS-REFERENCE TO RELATED APPLICATION

This application claims priority to and the benefit of Korean Patent Application No. 10-2021-00016416, filed in the Korean Intellectual Property Office on Jan. 6, 2021, the entire contents of which are incorporated by reference herein.

TECHNICAL FIELD

The present disclosure relates to a display device and, more particularly, to a flexible display device and a manufacturing method of the flexible display device.

DISCUSSION OF THE RELATED ART

A display device such as an organic light emitting diode (OLED) display device and the like includes a display panel, and the display panel is manufactured by including a plurality of layers and elements on a substrate. Conventionally, glass was used as the substrate of the display panel. However, the glass substrate is rigid and thus is difficult to twist or deform the display device to achieve a display device of a desired shape. Recently, a flexible display device that uses a flexible substrate, such as light and deformable plastic, has been researched and developed.

Depending on the usage or shape, the flexible display device may be classified into a bendable display device, a foldable display device, a rollable display device, and the like. Such a flexible display device may be twisted or folded owing to the use of a flexible substrate such as plastic.

SUMMARY

A flexible display device includes a first flexible substrate including a signal line disposed on a first side of the first flexible substrate; a second flexible substrate disposed on a second side of the first flexible substrate that is located opposite to the first side of the first flexible substrate; an opening that penetrates both the first flexible substrate and the second flexible substrate; a driver that is attached to the second flexible substrate; and a connection portion that electrically connects the driver to the signal line through the opening.

The flexible display device may further include an adhesive layer that attaches the second side of the first flexible substrate to a first side of the second flexible substrate.

The flexible opening may be continuous through the first flexible substrate, the adhesive layer, and the second flexible substrate.

The flexible display device may further include a metal mask that is disposed on a second side of the second flexible substrate, and includes a metal mask opening that corresponds to the opening penetrating both the first flexible substrate and the second flexible substrate.

The opening penetrating both the first flexible substrate and the second flexible substrate may expose a rear side of the signal line, and the connection portion may be connected to the rear side of the signal line.

The connection portion may contact a second side of the metal mask.

A plurality of pixels may be formed on the first side of the first flexible substrate, and the connection portion may be connected to the signal line in a non-display area where the plurality of pixels is not located.

A plurality of pixels may be formed on the first side of the first flexible substrate, and the connection portion may overlap a display area where the plurality of pixels is disposed.

The signal line may include a signal line opening, and the signal line opening, may overlap the opening that penetrates both the first flexible substrate and the second flexible substrate.

The flexible display device may further include an additional connection portion that is connected to the connection portion through the signal line opening, and the additional connection portion may contact the first side of the signal line.

The first flexible substrate may include two polyimide layers, the second flexible substrate may include two inorganic insulating layers, and the adhesive layer may bond the polyimide layer of the first flexible substrate to the polyimide layer of the second flexible substrate.

The flexible display device may further include: a plurality of pixels that is formed on the first side of the first flexible substrate; an encapsulation layer that may cover the plurality of pixels; a touch detector disposed on the encapsulation layer; and a window that may be disposed on the touch detector.

Two or more of the flexible display devices may be attached to each other.

A flexible display device includes: a first flexible substrate including pixels formed on a first side of first flexible substrate; a second flexible substrate disposed on a second side of the first flexible substrate that is located opposite to the first side of the first flexible substrate; an adhesive layer bonding the second side of the first flexible substrate and a first side of the second flexible substrate; and an optical element that is attached to a second side of the second flexible substrate.

The optical element may overlap a display area where the pixels are formed.

A light transmission area may overlap the optical element.

A method of manufacturing a flexible display device includes: forming, a signal line and pixels on a flexible substrate; folding the flexible substrate with the signal line and pixels formed thereon; bonding the folded flexible substrate using an adhesive layer to maintain the folded state; and cutting a folded portion of the flexible substrate to divide it into a first flexible substrate where the signal line and the pixels are located, and a second flexible substrate located on a rear side of the first flexible substrate.

The forming of the signal line and the pixels on the flexible substrate may further include forming a metal mask that includes an opening, and the method may further include: forming an opening that overlaps the signal line on the folded and attached flexible substrate using the metal mask as a mask; and forming a connection portion that is connected to the signal line through the opening of the flexible substrate.

The method may further include attaching a driver to the flexible substrate after the forming of the signal line and the pixels on the flexible substrate and before the folding of the flexible substrate.

The method may further include attaching an optical element onto the flexible substrate after the forming of the signal line and the pixels on the flexible substrate and before the folding of the flexible substrate.

A method for manufacturing a display device includes disposing an array of pixels on a top surface of a flexible substrate, disposing a signal line on the top surface of the flexible substrate, the signal line being connected to the array of pixels, applying an adhesive to a bottom surface of the flexible substrate, folding the flexible substrate such that a first portion of the bottom surface contacts a second portion of the bottom surface and the first portion is bound to the second portion by the adhesive, etching an opening though the folded flexible substrate, and disposing a connector within the opening to electrically connect the signal line to a driver through the folded flexible substrate.

The folded flexible substrate may be cut to divide the folded flexible substrate into a first flexible substrate and a second flexible substrate that are bound to each other by the adhesive.

A metal mask may be used to etch the opening though the folded flexible substrate.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein:

FIG. 21 is a schematic view of a large-scale display device including the flexible display device according to an embodiment of the present disclosure.

DETAILED DESCRIPTION

Figure 1:
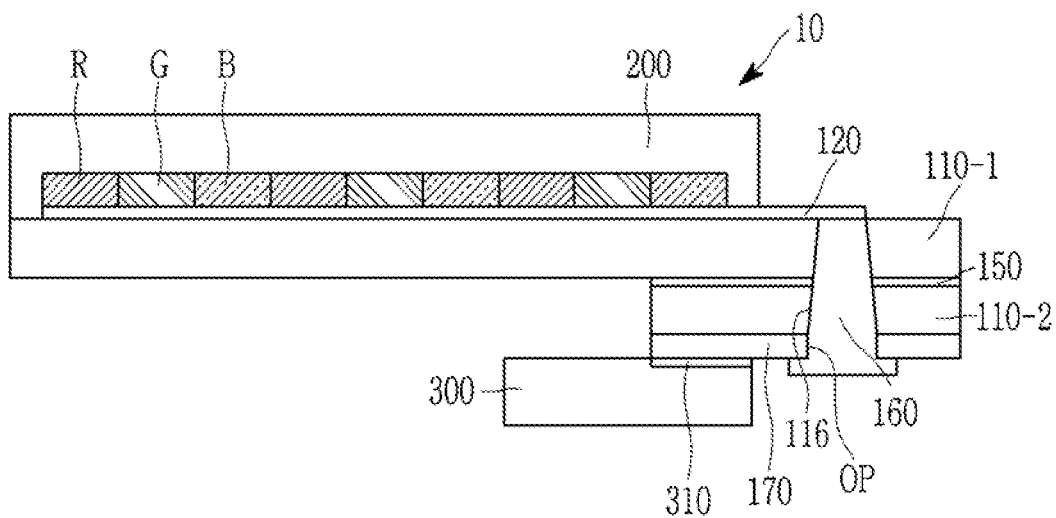
FIG. 1 is a cross-sectional view of a flexible display device according to an embodiment of the present disclosure.

The present invention will be described more fully hereinafter with reference to the accompanying drawings, in which example embodiments of the invention are shown. As those skilled in the art would realize, the described embodiments may be modified in various different ways, all without departing from the spirit or scope of the present invention.

In describing the present invention, like reference numerals may designate like elements throughout the specification.

The present invention is not necessarily limited to the relative size and thickness of the various elements illustrated in the drawings. In the drawings, the thickness of layers, films, panels, regions, etc., may be exaggerated for clarity.

It will be understood that when an element such as a layer, film, region, or substrate is referred to as being "on" another element it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on a direction of gravitational pull.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" or "in a plan view" means viewing a target portion from the top, and the phrase "on a cross-section" or "in a cross-sectional view" means viewing a cross-section formed by vertically cutting a target portion from the side.

Hereinafter, a display device according to the present embodiment will be described with reference to FIG. 1 and FIG. 2.

Figure 2:
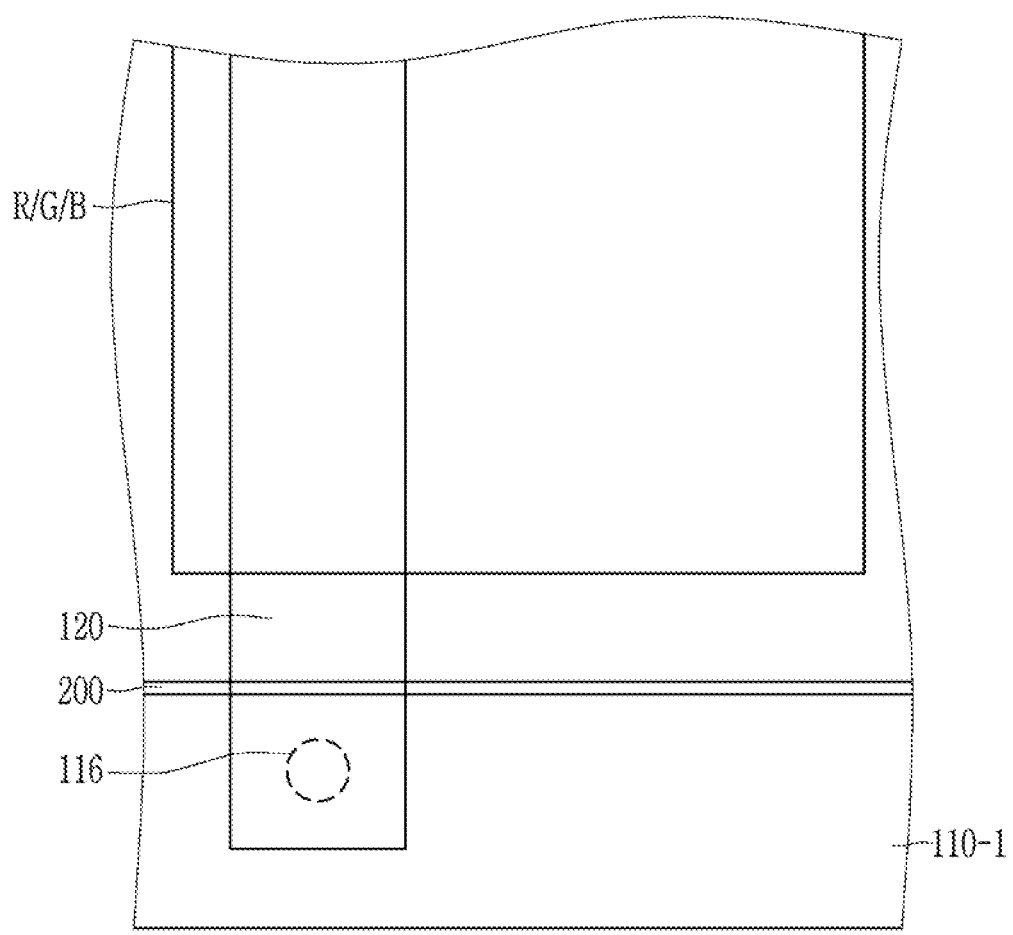
FIG. 2 is an enlarged top plan view of a part of the flexible display device according to an embodiment of the present disclosure.

FIG. 1 is a cross-sectional view of a flexible display device according to an embodiment of the present disclosure, and FIG. 2 is an enlarged top plan view of a part of the flexible display device according to the embodiment of the present disclosure.

A flexible display device 10, according to an embodiment of the present disclosure, includes a portion formed on a first flexible substrate 110-1, a portion formed on a second flexible substrate 110-2, an adhesive layer 150 that bonds the first flexible substrate 110-1 to the second flexible substrate 110-2, a driver 300 attached to one end of the second flexible substrate 110-2, and a connection portion 160 formed through both the first flexible substrate 110-1 and the second flexible substrate 110-2.

First, the portion formed on the first flexible substrate 110-1 will be described.

The portion formed on the first flexible substrate 110-1 includes a signal line 120, red pixels R, green pixels G, and blue pixels B connected to the signal line 120, and an encapsulation layer 200 that covers the signal line 120 and the pixels R, G, and B may be included on the portion.

An area where the respective pixels R, G, and B are located is referred to as a display area, and an area where the pixels R, G, and B are not located is referred to as a non-display area. Since the encapsulation layer 200 is a constituent element that protects the pixels R, G, and B, a space in which the encapsulation layer 200 is formed cannot be reduced, and thus, to reduce a width of the non-display area, the signal line 120 is extended to the outside of the encapsulation layer 200 to reduce the size of the part connected to the driver 300. According to an embodiment of the present disclosure, an opening 116 is continuously formed on the first flexible substrate 110-1, the second flexible substrate 110-2, and the adhesive layer 150 to electrically connect the signal line 120 and the driver 300 such that a connection portion 160 is electrically connected to a lower portion of the signal line 120. Thus, a fan-out area located in the non-display area is removed, and an area where the driver 300 is attached is located at a rear side of the first flexible substrate 110-1 while overlapping the display area, and accordingly, the size of the non-display area is reduced.

According to an embodiment of the present disclosure, an additional constituent element may be further included in an upper portion of the encapsulation layer 200 of the first flexible substrate 110-1. This will be described later with reference to FIG. 20.

The portion formed on the second flexible substrate 110-2 includes a metal mask 170 disposed at a rear side of the second flexible substrate 110-2. The metal mask 170 is formed of an electrically conductive metal, and includes an opening OP. The opening OP of the metal mask 170 may be located in an area that corresponds to an opening 116, which is formed while penetrating the first flexible substrate 110-1, the second flexible substrate 110-2, and the adhesive layer 150. Therefore, the metal mask 170 may be used as a mask for forming the opening 116. In addition, the opening OP of the metal mask 170 and the opening 116 formed in the first flexible substrate 110-1, the second flexible substrate 110-2, and the adhesive layer 150 may overlap each other in a plan view.

The metal mask 170 is electrically connected to the connection portion 160 formed in the opening 116 and the pad 310 of the driver 300 to serve to transmit a signal output from the driver 300 to the connection portion 160.

The adhesive layer 150 is disposed between the first flexible substrate 110-1 and the second flexible substrate 110-2. The adhesive layer 150 attaches the first flexible substrate 110-1 to the second flexible substrate 110-2. The adhesive layer 150 may include an organic material. The adhesive layer 150 is formed of an organic material such that the adhesive layer 150 can be removed by the same process when the opening 116 that penetrates the first flexible substrate 110-1 and the second flexible substrate 110-2 are formed.

The opening 116 is formed while the first flexible substrate 110-1 and the second flexible substrate 110-2 are attached by the adhesive layer such that the opening 116 can be continuously formed in the first flexible substrate 110-1, the second flexible substrate 110-2, and the adhesive layer 150. When the opening 116 is formed without attaching of the adhesive layer 150, the first flexible substrate 110-1 and the second flexible substrate 110-2 move with respect to each other and thus misalignment may occur. In particular, in FIG. 1, one signal line 120, one opening 116, and one connection portion 160 are illustrated, but it is to be understood that the opening 116 and the connection portion 160 need to be formed for each signal line 120, and thus there may be a problem in that the signal is not applied to signal line 120 or is applied to another signal line 120 in a case of misalignment of the opening 116. Thus, the opening 116 is formed after attaching the first flexible substrate 110-1 and the second flexible substrate 110-2 using the adhesive layer 150.

The driver 300 is attached to one end of the second flexible substrate 110-2. The driver 300 may include a driver IC, and the driver IC ma be formed on a printed circuit board or a flexible printed circuit board. The driver 300 further includes the pad 310, which is a portion of the driver 300 that outputs a signal to the signal line 120. The pad 310 is electrically connected with the metal mask 170 and transmits an output signal to the metal mask 170, and the output signal is transmitted to the signal line 120 through the metal mask 170 and the connection portion 160.

According to embodiments of the present disclosure, the driver IC may be directly attached to a bottom surface of the second flexible substrate 110-2. In this case, the metal mask 170 may electrically connect the connection portion 160 and an output terminal of the driver IC. In addition, a printed circuit board or a flexible printed circuit board may be additionally attached to the other end of the second flexible substrate 110-2 where the driver IC is not positioned.

The connection portion 160 is disposed in the opening 116 that is formed while penetrating the first flexible substrate 110-1 and the second flexible substrate 110-2, and the connection portion 160 is formed while filling the opening 116 with an electrically conductive material (e.g., a metal and the like).

A connection structure of the signal line 120 and the connection portion 160 will be described in more detail with reference to FIG. 2. In FIG. 2, the display device 10 is viewed from above the first flexible substrate 110-1, and a portion where one signal line 120 and the connection portion 160 are connected is enlarged.

As shown in FIG. 2, pixels R, G, and B and an encapsulation layer 200 that covers the pixels R, G, and B are formed on the first flexible substrate 110-1. The signal line 120 extends to the non-display area from the pixels R, G, and B, and may extend to a portion not covered by the encapsulation layer 200 in the non-display area. The connection portion 160 and the opening 116 overlap the non-display area on a plane. The opening 116 that penetrates the first flexible substrate 110-1 and the second flexible substrate 110-2 is formed in the rear surface of the signal line 120, and the signal line 120 has a structure in which the connection portion 160 contacts the rear surface of the signal line 120 through the opening 116.

Thus, the driver 300 is hidden by the rear surface of the flexible substrates 110-1 and 110-2 such that a size of the non-display area is reduced. In addition, since the fan-out region in which the signal line 120 is formed to receive a signal from the driver 300 is not formed (e.g., omitted), to the size of the non-display area is reduced. According to embodiments of the present disclosure, since the signal line 120 is not electrically connected from the side but electrically connected through the rear surface, the size of the on-display area is reduced.

In FIG. 2, a thickness of the signal line 120 is enlarged, but the signal line 120 may have a thickness of about several micrometers to several tens of micrometers, and depending on the technology development, it can be formed with a thin wire.

In addition, as shown in FIG. 1, although the connection portion 160 is formed in the non-display area, the width of the non-display area may be several micrometers to several tests of micrometers, which is not visible to a user.

A method for manufacturing the display device 10, according to an embodiment will be sequentially described with reference to FIG. 3 to FIG. 7.

FIG. 3 to FIG. 7 show a method of manufacturing the flexible display device of FIG. 1.

Figure 3:
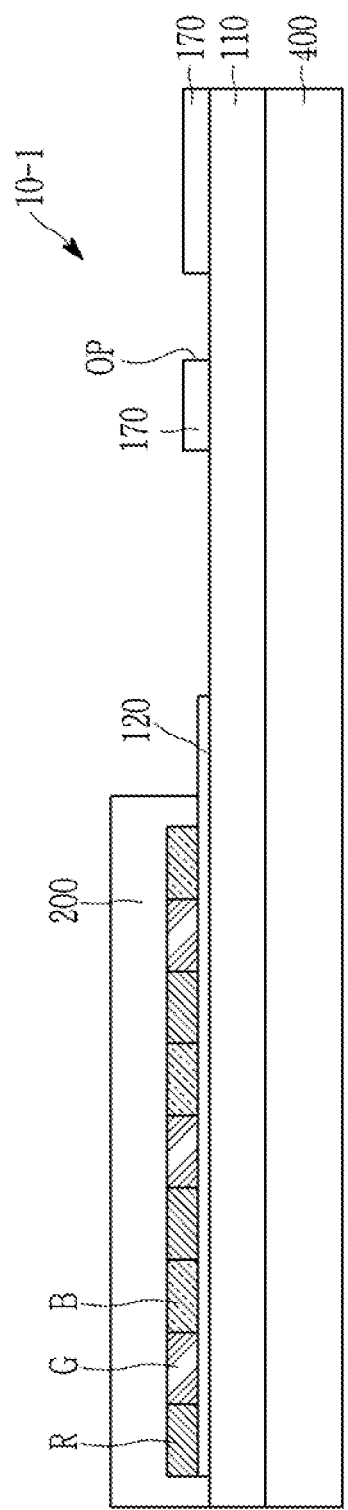
FIG. 3 to FIG. 7 illustrate a method of manufacturing the flexible display device of FIG. 1.

FIG. 3 illustrates forming the signal line 120 and the pixels R, G, and B on the flexible substrate 110, and forming the metal mask 170 including the opening OP on the flexible substrate 110.

The flexible substrate 110 is formed on the glass substrate 400, and then the signal line 120 and the pixels R, G, and B are formed on the flexible substrate 110. In this case, the metal mask 170 including the opening OP can be formed together. The metal mask 170 and the signal line 120 may be formed through the same process using the same mask with the same material. According to embodiments of the present disclosure, the metal mask 170 may be formed through the same process using the same mask with the same material of a metal layer included in pixels R, G, and B.

After that, the encapsulation layer 200 covering the pixels R, G, and B is formed. The encapsulation layer 200 protects the pixels R, G, and B from moisture or oxygen, and particularly, when the pixels R, G, and B include an organic emission layer, the encapsulation layer 200 is formed to block moisture or oxygen to thereby prevent deterioration of the organic emission layer because the organic emission layer is susceptible to moisture or oxygen. The encapsulation layer 200 includes an organic layer and an inorganic layer, and the organic layer and the inorganic layer may be alternately formed, and according to embodiments of the present disclosure, a triple layer of an inorganic layer, an organic layer, and an inorganic layer may be defined.

The metal mask 170 formed on the flexible substrate 110 includes an opening OP, and one opening OP is formed for each signal line 120 and thus a plurality of opening OPs are formed. Each opening OP may have a circular cross-section, and may have various other shapes.

As shown in FIG. 3, the flexible substrate 110 is placed on the glass substrate 400, and then the signal lines 120, the metal mask 170, and the like are formed. Accordingly, the use of the glass substrate 400 may prevent the flexible substrate 110 from being deformed due to heat applied during laminating and etching processes.

Figure 4:
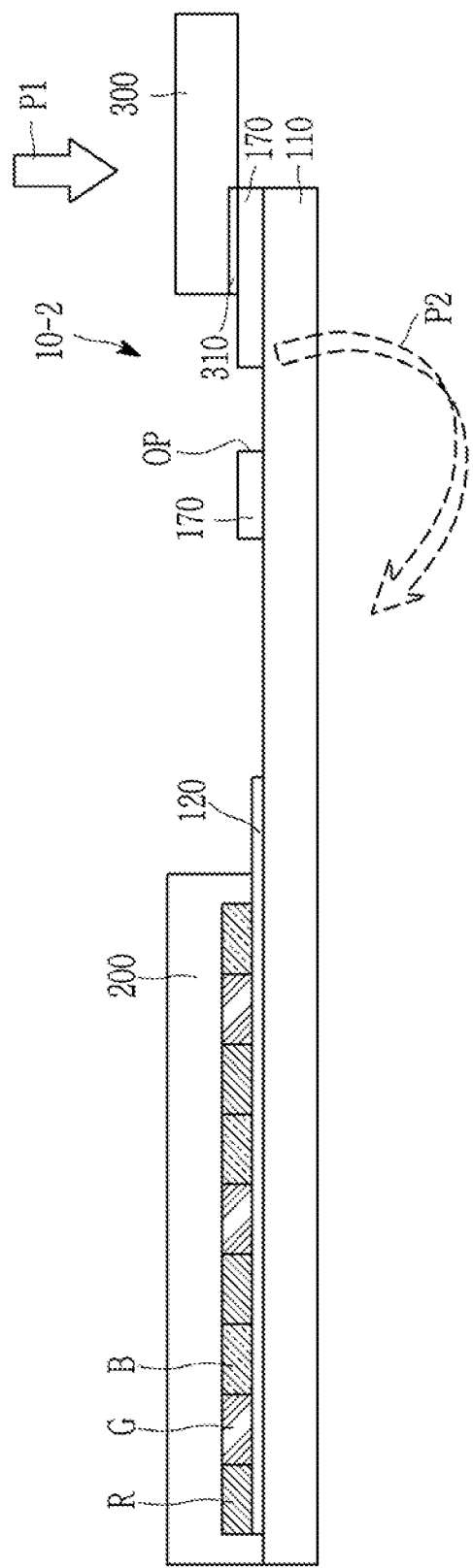

As shown in FIG. 4, an attachment process of the driver 300 and a process P2 for folding the flexible substrate 110 are performed on a display device 10-1, which has been formed as shown in FIG. 3. Before forming the flexible substrate 110, a process for folding after detaching the glass substrate 400 is carried out. Thereafter, the glass substrate 400 may be detached from the flexible substrate 110 through a lift-off method, for example, using a laser.

In FIG. 4, the process P1 for attaching the driver 300 on the flexible substrate 110 and the process P2 for forming the flexible substrate 110 are illustrated.

Referring to FIG. 4, the driver 300 is attached to electrically connect the metal mask 170 and the pad 310 of the driver 300. Here, according to embodiments of the present disclosure, the driver 300 may be formed during a process for forming the signal line 120, the pixels R, G, and B, and the encapsulation layer 200.

The driver 300 of the display device 10-2 undergoes a process P2 for folding after detaching the glass substrate 400.

Figure 5:
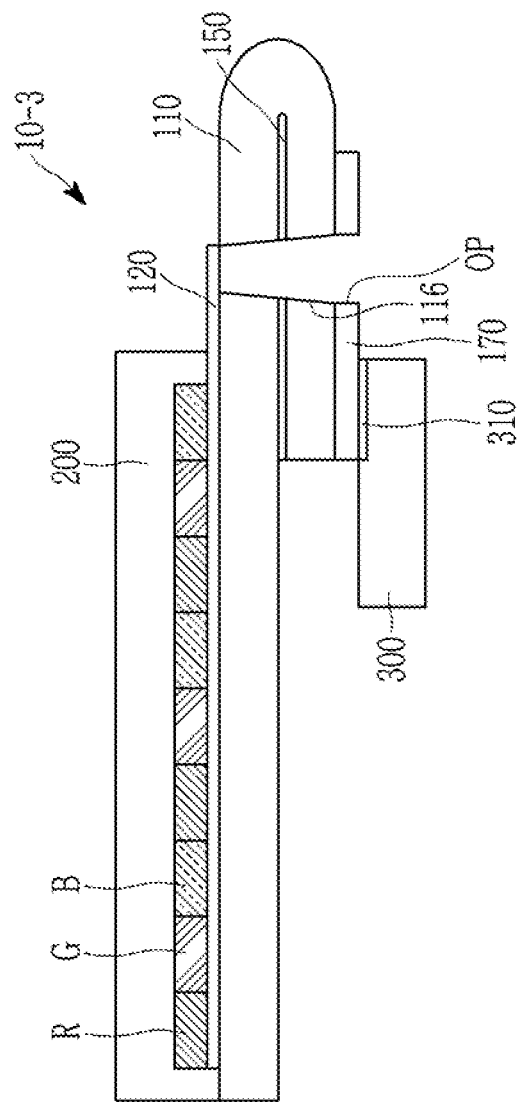

In this case, as shown in FIG. 5, the folded flexible substrate 110 and a rear surface of the flexible substrate 110 are bonded to each other by using an adhesive layer 150. According to embodiments of the present disclosure, the adhesive layer 150 may be formed on the rear surface of the flexible substrate 110 before the process P2 is performed. Thus, when the folding process P2 is carried out, the rear surfaces of the flexible substrate 110 can be bonded to each other by the adhesive layer 150. Meanwhile, according to embodiments of the present disclosure, the adhesive layer 150 may be formed on the rear surface of the substrate 110 after performing the folding process P2, and accordingly, the rear surfaces of the flexible substrate 110 can be attached to each other by the adhesive layer 150 in a separate process from the folding process P2.

After that, as shown in FIG. 5, the opening 116 is formed in the flexible substrate 110 and the adhesive layer 150.

In FIG. 5, the signal line 120 and the pixels R, G, and B are located in an upper part of the flexible substrate 110. A remainder of the flexible substrate 110 is disposed in a lower part of the flexible substrate 110 and this lower part overlaps the upper part. The signal line 420 is attached to the upper part of the folded flexible substrate 110 using the adhesive layer 150, and the opening 116 overlaps the signal line 120 on a plane in the folded state. The metal mask 170 includes an opening OP that corresponds to the opening 116 of the flexible substrate 110.

Here, the opening 116 may be formed through a laser etching method such as laser drilling or dry etching using the metal mask 170 as a mask. For example, the opening 116 is formed while the flexible substrate 110 exposed through the opening OP portion of the metal mask 170 is removed. In particular, since the rear surfaces of the flexible substrate 110 are bonded to each other by the adhesive layer 150, the openings 116 formed on the flexible substrate 110 on both sides can be maintained without shifting. In addition, as the flexible substrate 110 is removed by the opening 116, the bottom surface of signal line 120 is exposed. In addition, the adhesive layer 150 can be removed by the same process during laser etching or dry etching to form the opening 116 penetrating through the first flexible substrate 110-1 and the second flexible substrate 110-2 by forming the adhesive layer 150 of an organic material.

Figure 6:
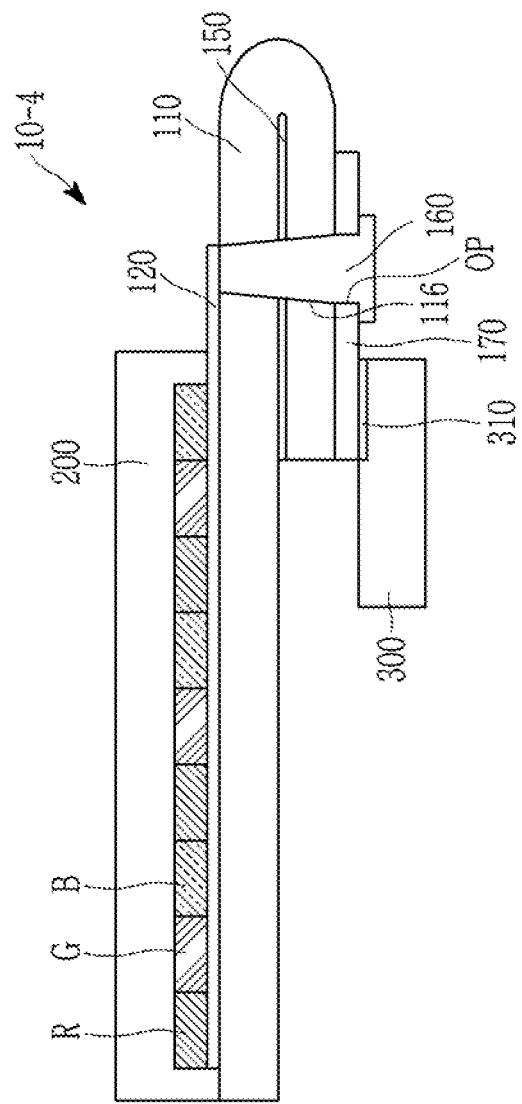

After that, as shown in FIG. 6, a connection portion 160 is formed in a display device 10-3 where the opening 116 is formed (e.g., the connection portion 160 is formed within the opening 116).

In FIG. 6, a step for forming the connection portion 160 connected with the signal line 120 through the openings 116 of the flexible substrate 110 is illustrated.

The connection portion 160 is formed in the opening OP of the metal mask 170 and the opening 116 of the flexible substrate 110 and the adhesive layer 150. The connection portion 160 may be formed by filling a space with a metallic material (e.g., a metal). For example, the connection portion 160 may be formed by an inkjet printing method or a screen printing method. The connection portion 160 is electrically connected to the rear surface of the signal line 120 exposed through the opening 116 and the metal mask 170. Since the metal mask 170 is electrically connected to the driver 300, the driver 300 is electrically connected to the signal line 120.

After that, as shown in a display device 10-4 where the connection portion 160 is formed, the flexible substrate 110 is cut along a cutting line CL.

Figure 7:
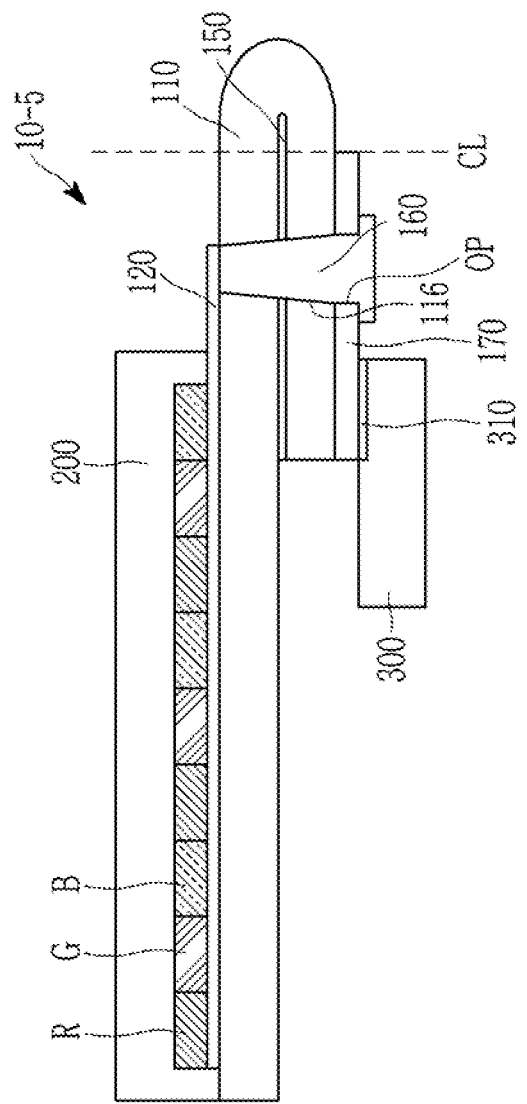

FIG. 7 illustrates separating the flexible substrate 110 into the first flexible substrate 110-1, where the signal line 120 and the pixels R, G, and B are located, and the second flexible substrate 110-2, disposed in the rear surface of the flexible substrate 110-1, by cutting the folded portion of the flexible substrate 110 along the cutting line CL.

The cutting of the flexible substrate 110 may be performed, for example, using a laser.

In a display device 10-5 that has undergone the cutting process, the flexible substrate 110 is separated into the first flexible substrate 110-1 and the second flexible substrate 110-2 such that the structure shown in FIG. 1 is completed.

In the above-described arrangement, the rear surface of the signal line 120 is exposed through the opening 116 formed in the flexible substrates 110-1 and 110-2 and the adhesive layer 150 such that the connection portion 160 is directly connected with the rear surface of the signal line 120.

However, according to embodiments of the present disclosure, an opening may be additionally formed in the signal line 120, and an additional connection portion may be formed and electrically connected to the signal line 120.

This will be described with reference to FIG. 8 and FIG. 9.

Figure 8:
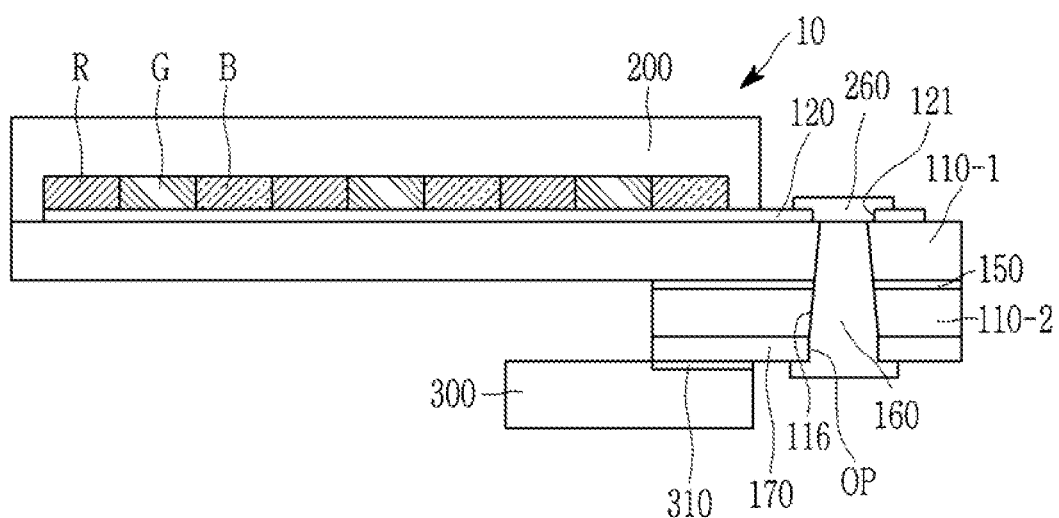
FIG. 8 is a cross-sectional view of a flexible display device according to an embodiment of the present disclosure.
Figure 9:
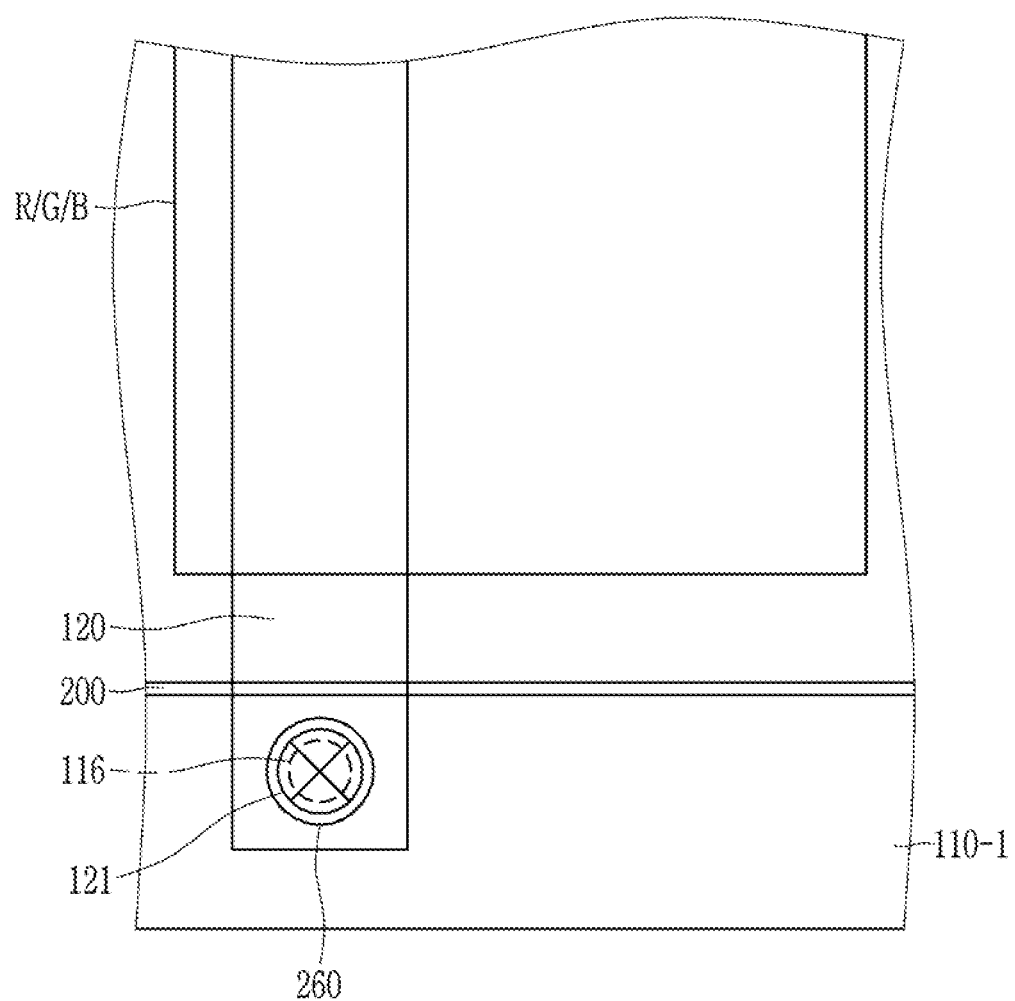
FIG. 9 is a top plan view of a partially enlarged portion of the flexible display device shown in FIG. 8.

FIG. 8 is a cross-sectional view of a flexible display device according to an embodiment of the present disclosure, and FIG. 9 is a top plan view of a partially enlarged portion of the flexible display device according to the arrangement illustrated in FIG. 8.

In the arrangement illustrated in FIG. 8 and FIG. 9, the signal line 120 includes an opening 121 such that a rear surface of the signal line 120 is not exposed by an opening 116 formed in flexible substrates 110-1 and 110-2, and the signal line 120 and the connection portion 160 are to electrically connected with each other through the additional connection portion 260.

Referring to FIG. 9, the opening 116 formed in the flexible substrates 110-1 and 110-2 may be smaller than the opening 121 formed in the signal line 120. Thus, it is difficult for the connection portion 160 to be directly connected with the signal line 120. Thus, the connection portion 160 and the signal line 120 are electrically connected by using the additional connection portion 260. The additional connection portion 260 may have a structure that contacts the top surface of the signal line 120.

In the arrangement illustrated in FIG. 8 and FIG. 9, the signal line 120 is electrically connected not through a side surface but through a rear surface, and thus a size of the non-display area is reduced.

In the above, an arrangement in which the signal line 120 extends to the non-display area, and the signal line 120 and the connection portion 160 are connected to each other through the rear surface in the non-display area, has been described.

However, according to embodiments of the present disclosure, the connection portion 160 may be connected through the rear surface of the signal line 120 in the display area. This will be described with reference to FIG. 10 and FIG. 11.

Figure 10:
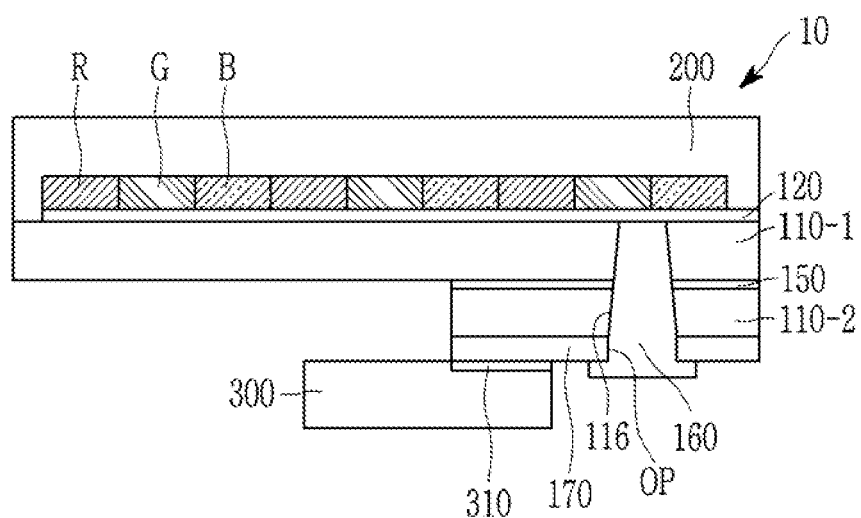
FIG. 10 is a cross-sectional view of a flexible display device according to an embodiment of the present disclosure.
Figure 11:
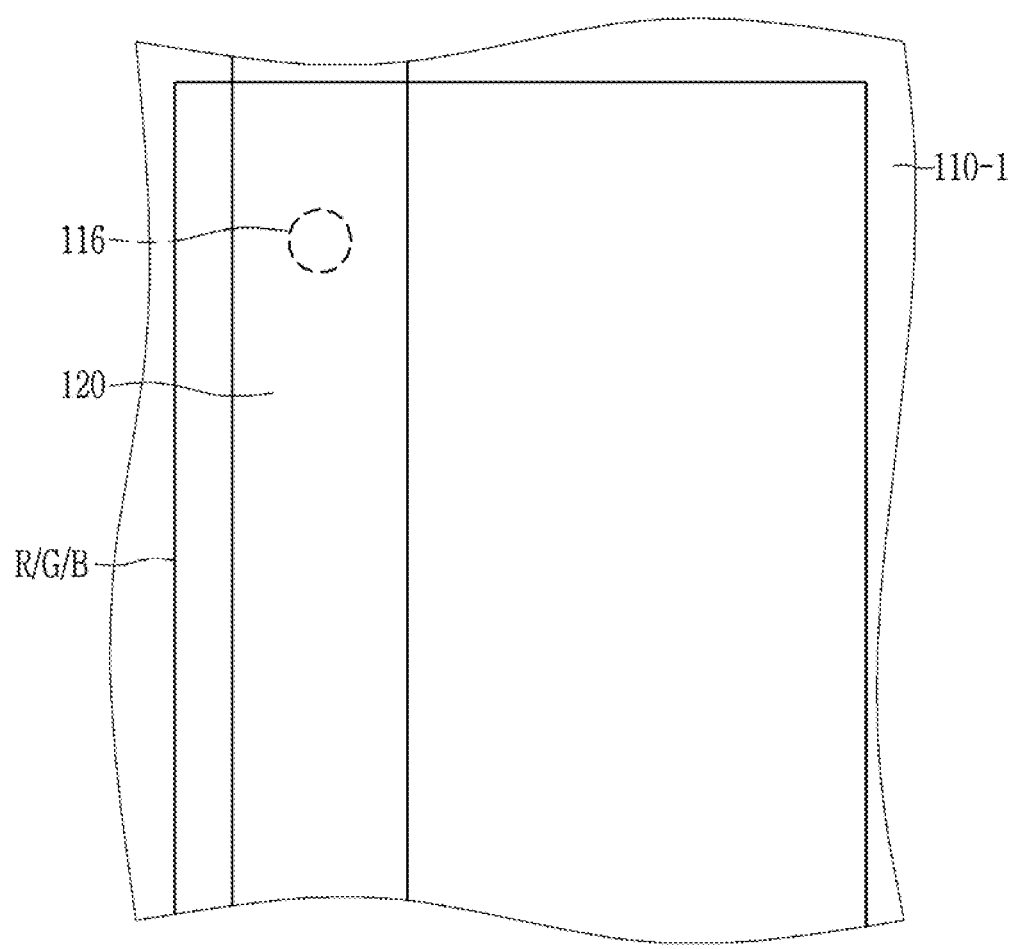
FIG. 11 is a top plan view of an enlarge portion of the flexible display device shown in FIG. 10.

FIG. 10 is a cross-sectional view of a flexible display device according to an embodiment of the present disclosure, and FIG. 11 is a top plan view of an enlarged portion of the flexible display device shown in FIG. 10.

In the arrangement illustrated in FIG. 10 and FIG. 11, a rear side of a signal line 120 and a connection portion 160 are connected with each other in a display area, and the connection portion 160 and an opening 116 overlap the display area on a plane. For example, an opening 116 formed in a first flexible substrate 110-1 and a second flexible substrate 110-2, and an adhesive layer 150 is formed on a rear side of the display area. The connection portion 160 is formed through the opening 116 and thus is connected to the rear side of the signal line 120.

The connection portion 160 is also disposed in an opening OP of a metal mask 170, and electrically connects the metal mask 170 and the signal line 120 while being electrically connected with the metal mask 170.

The metal mask 170 is connected to a driver 300 through a pad 310 and thus an output signal of the driver 300 is transmitted to the signal line 120.

In the arrangement illustrated in FIG. 10 and FIG. 11, the size of a non-display area can be further reduced as compared to the arrangement illustrated in FIG. 1 to FIG. 9. For example, in the arrangement illustrated in FIG. 1 to FIG. 9, the signal line 120 extends to the non-display area and thus is connected to the connection portion 160 in the non-display area such that a size of the non-display area is made larger by as much as the space in which the connection portion 160 is formed. However, in the arrangement illustrated in FIG. 10 and FIG. 11, the signal line 120 and the connection portion 160 overlap in the display area and thus the signal line 120 does not need to extend to the non-display area, thereby further reducing the non-display area.

Hereinafter, a method for manufacturing the display device according to an arrangement illustrated in FIG. 1 will be described.

In FIG. 3 to FIG. 7, the flexible substrate 110 is folded and then cut into the first flexible substrate 110-1 and the second flexible substrate 110-2, but according to example embodiments of the present disclosure, the first flexible substrate 110-1 and the second flexible substrate 110-2 may be separately manufactured from the beginning as opposed to being cut from a single structure and then attached to one another, and then the opening 116 may be formed.

This arrangement will be described with reference to FIG. 12 to FIG. 15.

FIG. 12 to FIG. 15 illustrate a method for manufacturing a flexible display device according to an embodiment of the present disclosure.

Figure 12:
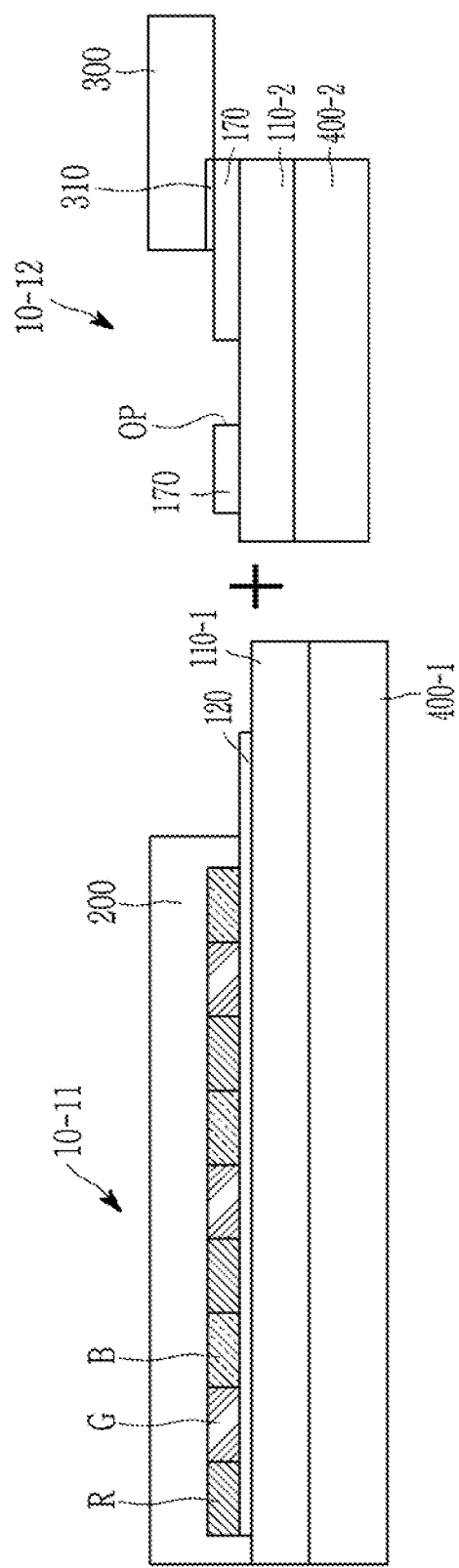
FIG. 12 to FIG. 15 illustrate a method for manufacturing a flexible display device according to an embodiment of the present disclosure.

First, referring to FIG. 12, a first flexible substrate 110-1 is formed on a first glass substrate 400-1, and then a signal line 120, pixels R, G, and B, and an encapsulation layer 200 are formed on the flexible substrate 110-1 such that a first portion 10-11 of a display device is formed.

Separately, a second flexible substrate 110-2 is formed on a second glass substrate 400-2 and then a metal mask 170 that includes an opening OP is formed on the second flexible substrate 110-2, and a driver 300 is attached to electrically connect a pad 310 to the metal mask 170 such that a second portion 10-12 of the display device is formed.

Figure 13:
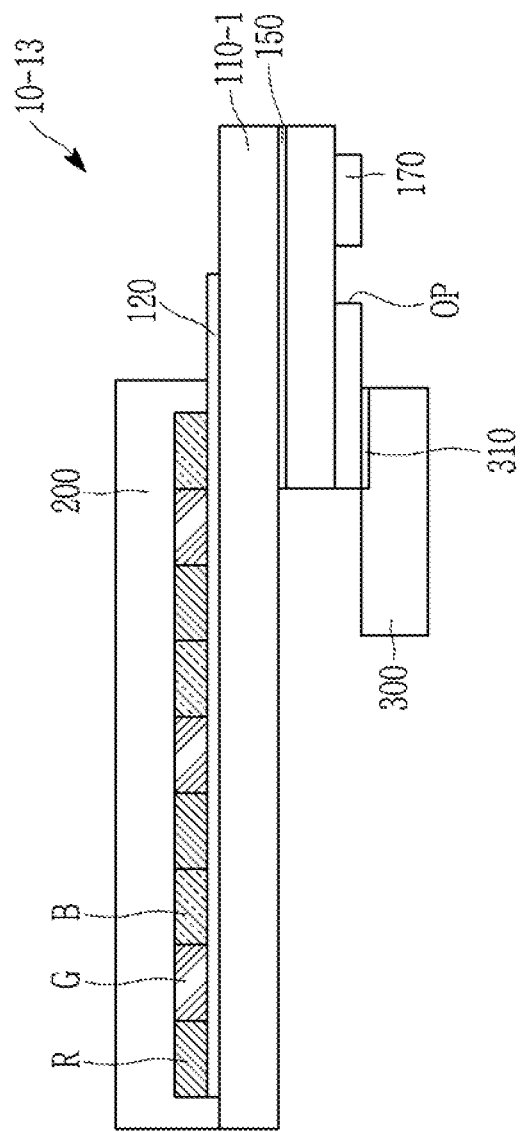

After that, as shown in FIG. 13, the first glass substrate 400-1 and the second glass substrate 400-2 are detached from the first portion 10-11 and the second portion 10-12 of the display device, respectively. After that, a rear side of the first flexible substrate 110-1 and a rear side of the second flexible substrate 110-2 are bonded to each other by an adhesive layer 150 such that a display device 10-13 is formed.

Figure 14:
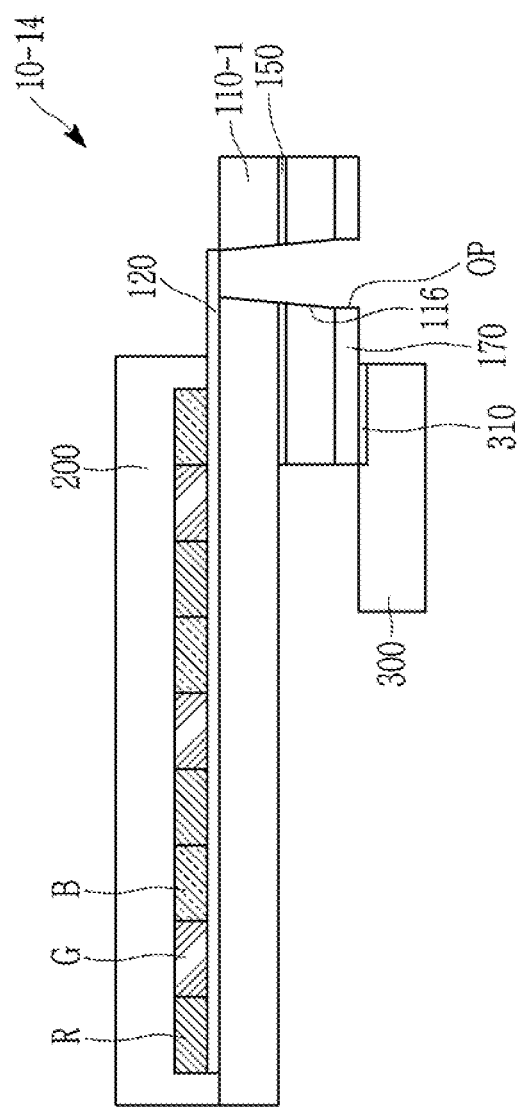

After that, as shown in FIG. 14, an opening 116 that penetrates the first flexible substrate 110-1, the second flexible substrate 110-2, and the adhesive layer 150 is formed. The opening 116 may have the same shape as the opening OP of the metal mask 170 by using the metal mask 170 as a mask when etching the first flexible substrate 110-1, the second flexible substrate 110-2, and the adhesive layer 150.

Figure 15:
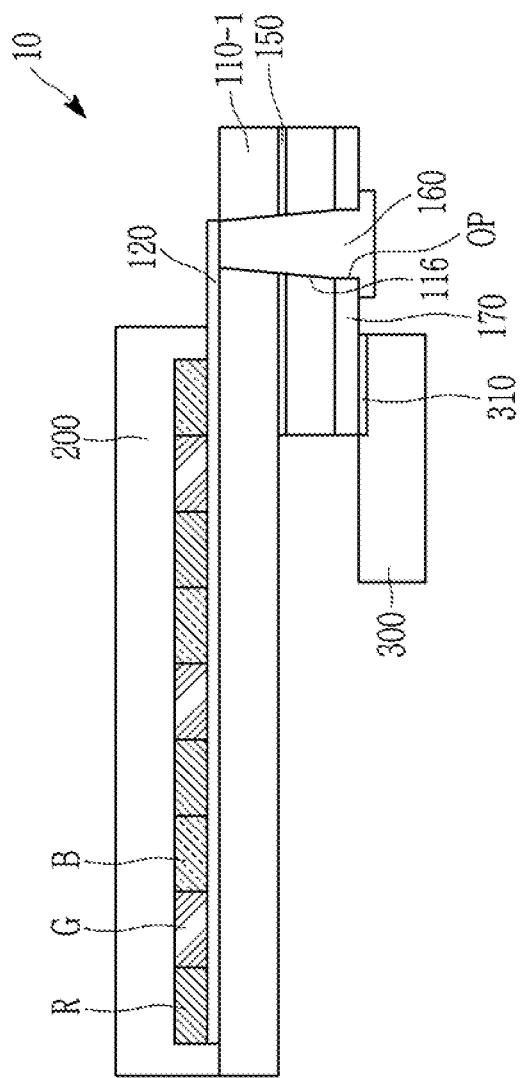

After that, as shown in FIG. 15, a connection portion 160, that is connected to a rear side of the signal line 120 through the opening 116, is formed on a display device 10-14 having the opening 116 formed through the process of FIG. 14. The connection portion 160 electrically connects the signal line 120 and the metal mask 170 by contacting a side surface and/or a bottom surface of the metal mask 170. Accordingly, a display device 10 that is the same as that of FIG. 1 is firmed.

Therefore, as shown in the display device 10 of FIG. 1, the driver 300 is hidden by the rear sides of the flexible substrates 110-1 and 110-2 such that a size of the non-display area is reduced. In addition, the fan-out region formed by the signal line 120 to receive a signal from the driver 300 is not formed, thereby reducing the non-display area. According to the present arrangement, since the signal line 120 is not electrically connected from the side but electrically connected through the rear side, the size of the non-display area is reduced.

Meanwhile, the manufacturing method of FIG. 12 to FIG. 15 can be applied to a structure in which the opening 121 is formed in the signal line 120 and is connected through the additional connection portion 260 as shown in FIG. 8 and FIG. 9, and may also be applied to a structure in which the signal line 120 and the connection portion 160 are connected in the display area as shown in FIG. 10 and FIG. 11.

Hereinabove, an arrangement in which the driver 300 and the signal line 120 are electrically connected by using the opening 116 that penetrates the first flexible substrate 110-1, the second flexible substrate 110-2, and the adhesive layer 150, and the connection portion 160, has been described.

However, the method in which the flexible substrate is folded and then cut to reduce the non-display area as shown in FIG. 3 to FIG. 7 may also be used in manufacturing of a display device where an optical element 500 is formed on a rear side of a display area.

This arrangement will be described with reference to FIG. 16 to FIG. 19.

First, a cross-sectional structure of a display device where an optical element 500 is disposed on a rear side of a display area will be described with reference to FIG. 16.

Figure 16:
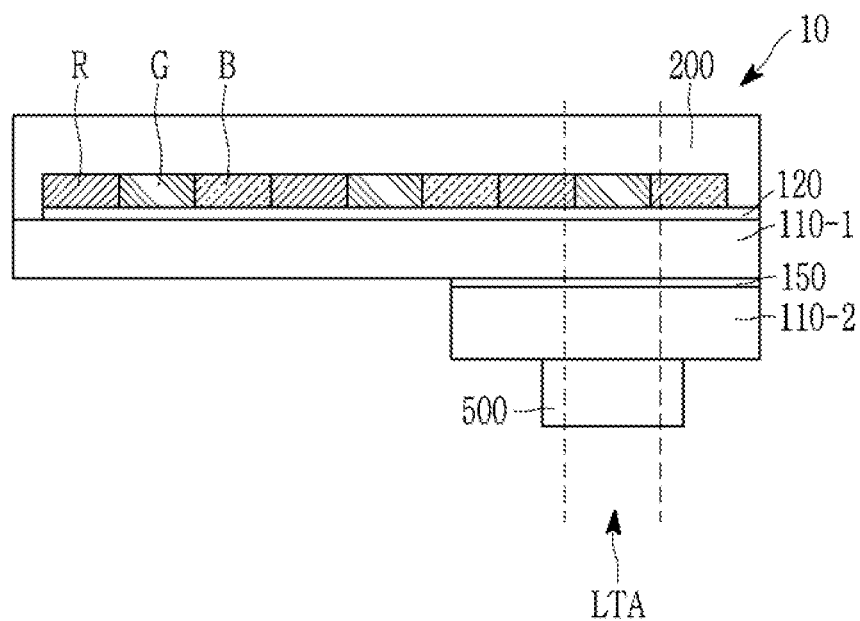
FIG. 16 is a cross-sectional view of a flexible display device according to an embodiment of the present disclosure.

FIG. 16 is a cross-sectional view of a flexible display device according to an embodiment of the present disclosure.

A flexible display device 10, according to an example embodiment of the present disclosure, includes a portion formed on a flexible display device 10, a portion formed on a second flexible substrate 110-2, an adhesive layer 50 that bonds the first flexible substrate 110-1 and the second flexible substrate 110-2, and an optical element 500 attached to the adhesive layer 150 and the second flexible substrate 110-2.

The portion formed on the first flexible subs 110-1 is substantially the same as the portion shown in FIG. 1. For example, the portion formed on the first flexible substrate 110-1 includes the first flexible substrate 110-1, and may include a signal line 120, pixels R, G, and B that are connected to the signal line 120, and an encapsulation layer 200 that covers the respective pixels R, G, and B, which are formed on the first flexible substrate 110-1.

The portion formed on the second flexible substrate 110-2 includes the second flexible substrate 110-2 and the optical element 500 disposed in the rear surface of the second flexible substrate 110-2. Various optical elements such as an optical sensor, a bio sensor, a camera, a flash, and the like may be used as the attachable optical element 500. The optical sensor may be, for example, an infrared sensor, and the bio sensor may be, for example, a fingerprint recognition sensor.

An adhesive layer 150 is disposed between the first flexible substrate 110-1 and the second flexible substrate 110-2. The adhesive layer 150 bonds the first flexible substrate 110-1 and the second flexible substrate 110-2 to each other.

The optical element 500 is disposed on the rear side of the display area while the first flexible substrate 110-1 and the second flexible substrate 110-2 are attached to each other such that the optical element 500 overlaps the display area on a plane. Some of the display area may include a light transmission area LTA such that light can be incident on the optical element 500. According to example embodiments of the present disclosure, the pixels R, G, and B located in the light transmission area LTA have lower density per unit area compared to other portions of the display area, thereby increasing light transmittance.

Hereinafter, a method of manufacturing the arrangement shown in FIG. 16 will be described with reference to FIG. 17 to FIG. 19.

Figure 17:
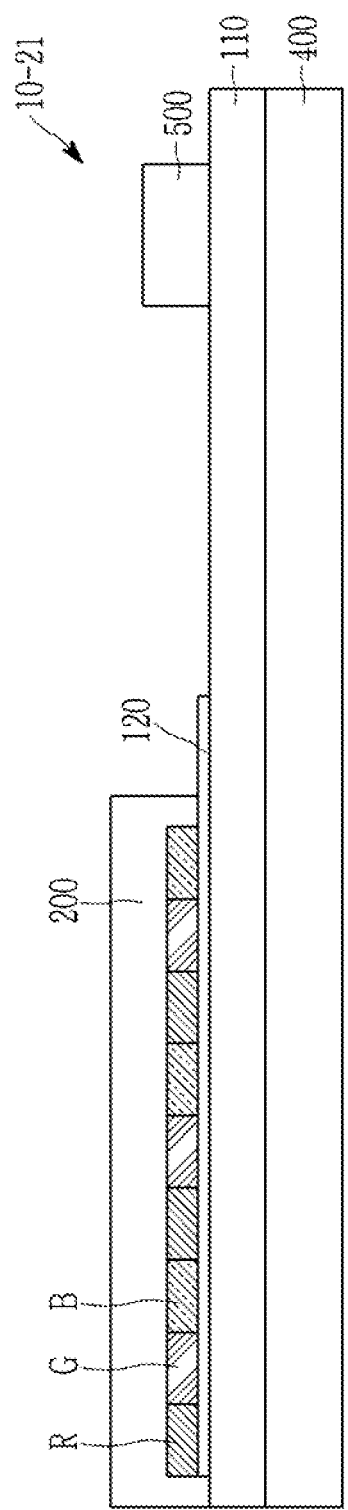
FIG. 17 to FIG. 19 illustrate a manufacturing method of the flexible display device of FIG. 1.
Figure 18:
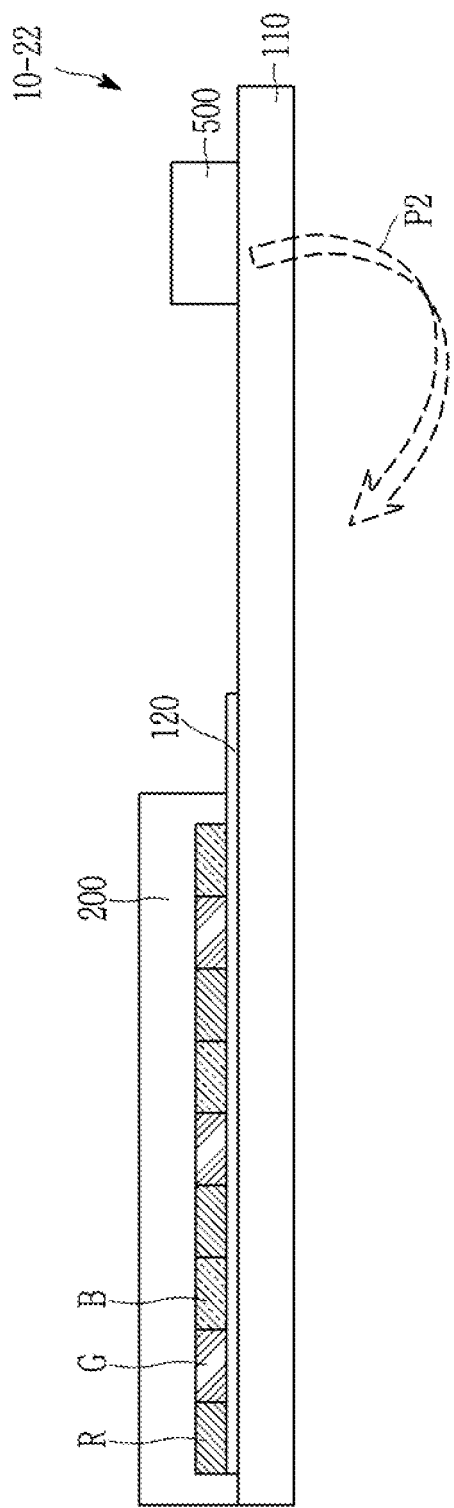
Figure 19:
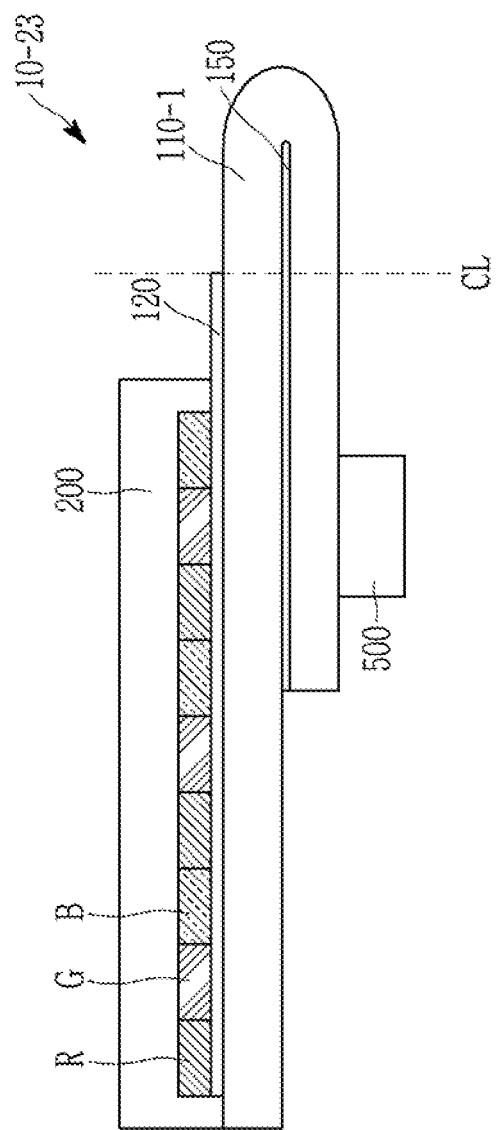

FIG. 17 to FIG. 19 illustrate a manufacturing, method of the flexible display device of FIG. 16.

In FIG. 17, forming the signal line 120 and the pixels R, G, and B on the flexible substrate 110 and attaching the optical element 500 onto the flexible substrate 110 are illustrated.

As shown in FIG. 17, the flexible substrate 110 is formed on a class substrate 400, the signal line 120 and the pixels R, G, and B are formed on the flexible substrate 110, and then the encapsulation layer 200 covering the signal line 120 and the pixels R, G, and B is formed.

In addition, the optical element 500 is additionally attached to the non-display area of the flexible substrate 110 such that a display device 10-21 is completed.

After that, as shown m FIG. 18, a process P2 for folding a display device 10-22 from which the glass substrate 400 is detached is carried out.

In FIG. 18, the process P2 for folding the flexible substrate 110 is illustrated.

The adhesive layer 150 is formed on the rear side of the flexible substrate 110 before or after the folding process P2 of FIG. 18 such that the rear sides of the flexible substrate 110 are bonded to each other as shown in FIG. 19. For example, according to example embodiments of the present disclosure, the folding process P2 is performed after forming the adhesive layer 150 in the rear side of the flexible substrate 110 such that the rear sides of the flexible substrate 110 are attached to each other in the folding process P2. Meanwhile, depending on example embodiments of the present disclosure, the adhesive layer 150 is formed on the rear side of the flexible substrate 110 after the folding process P2 such that the rear sides of the flexible substrate 110 may be attached to each other by the adhesive layer 150 in a process that is separate from the folding process P2. When the rear sides of the flexible substrate 110 are attached to each other, they may be attached while matching a position her the optical element 500 is to be aligned.

In FIG. 18, the folded flexible substrate 110 is attached by using the adhesive layer 150 such that a portion of the flexible substrate 110, in which the signal line 120 and the pixels R, G, and B are located, is disposed in an upper portion, and a part of the rest of the flexible substrate 110 is located in a lower portion that overlaps the signal line 120.

After that, the flexible substrate 110 is cut along a cutting line CL of FIG. 19.

In FIG. 19, separating a folded portion of the flexible substrate 110 into the first flexible substrate 110-1 where the signal line 120 and the pixels R, G, and B are disposed and the second flexible substrate 110-2 located in the rear side of the first flexible substrate 110-2 by cutting along the cutting lite CL is illustrated.

The flexible substrate 110 is divided into the first flexible substrate 110-1 and the second flexible substrate 110-2 through the cutting process such that a structure shown in FIG. 16 is completed.

Depending on example embodiments of the present disclosure, a structure in which the connection portion 160 disposed on the rear side of the signal line 120 is used for connection as shown in FIG. 1 to FIG. 15, and the structure in which the optical element 500 is formed on the rear side of the second flexible substrate 110-2 as shown in FIG. 16 to FIG. 19, can be formed together. For example, one side of the flexible substrate 110 is folded and thus connected with the connection portion 160 through the rear side of the signal line 120, while folding the other side of the flexible substrate 110 to locate the optical element 500 in a lower portion of the display area.

Hereinabove, arrangements in which the portion formed on the first flexible substrate 110-1 includes the first flexible substrate 110-1, and includes the signal line 120 formed on the first flexible substrate 110-1, the pixels R, G, and B connected to the signal line 120, and the encapsulation layer 200 covering the signal line 120 and the respective pixels R, G, and B, has been described.

Hereinafter, a structure that can be additionally formed on the encapsulation layer 200 will be described in detail with reference to FIG. 20.

Figure 20:
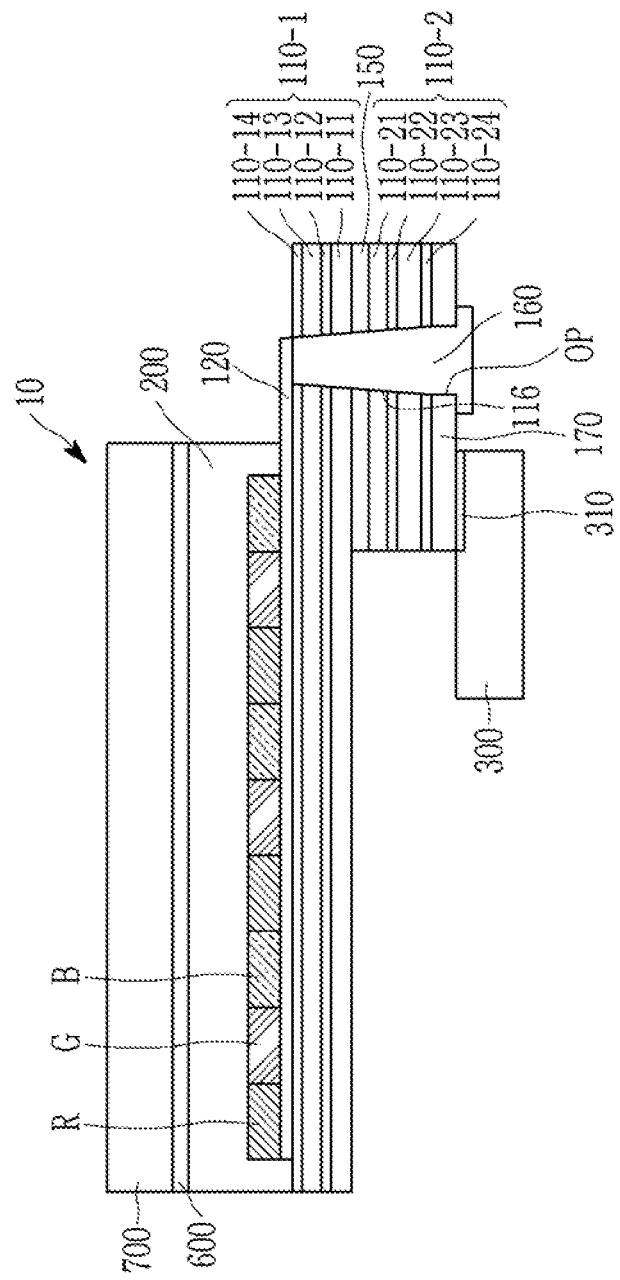
FIG. 20 is a cross-sectional view of a flexible display device according to an embodiment of the present: disclosure.

FIG. 20 is a cross-sectional view of a flexible display device according to an embodiment of the present disclosure.

Referring to FIG. 20, a display device 10 is provided above the first flexible substrate 110-2. A touch detector 600 and a window 700 are disposed on the encapsulation layer 200.

After forming an inorganic insulation layer on the encapsulation layer 200, a touch detection electrode is formed such that the touch detector 600 can be formed.

In addition, the window 700 that protects the touch detector 600 and the pixels R, G, and B may be further included.

In FIG. 20, a configuration of the flexible substrates 110-1 and 110-2 is illustrated in more detail.

For example, each of the flexible substrates 110-1 and 110-2 is formed of four layers, and each includes two polyimide (PI) layers 110-11, 110-13, 110-21, and 110-23 and two inorganic insulating layers 110-12, 110-14, 110-22, and 110-24. Layers attached by the adhesive layer 150 include a first polyimide layer 110-11 of the first flexible substrate 110-1 and a first polyimide layer 110-21 of the second flexible substrate 110-2.

In FIG. 20, each of the polyimide layers 110-11, 110-13, 110-21, and 110-23 are thicker than each of the inorganic insulating layers 110-12, 110-14, 110-22, and 110-24, but the may have almost the same thickness depending on various different arrangements. In addition, the thickness of the polyimide layers 110-11, 110-13, 110-21, and 110-23 may be about 10 μm or more and about 20 μm or less, and the thickness may be about 15 μm or more and about 16 μm or less in the present arrangement.

However, depending on the various arrangements, each of the flexible substrates 110-1 and 110-2 may be formed of one polyimide layer and one inorganic insulating layer.

Hereinabove, the display device 10 in which a signal is received through the rear side of the signal line 120 and thus the size of the non-display area is reduced may be formed as a large-scale display device by attaching a plurality of display devices 10. This will be described with reference to FIG. 21.

FIG. 21 is a schematic view of a large-scale display device including the flexible display device according to example embodiments of the present disclosure.

As shown in FIG. 21, a large-scale display device 1 is formed by attaching a plurality of display devices 10. In the arrangement shown in FIG. 21, four display devices 10 are attached. However, depending on the various arrangements, the large-scale display device 1 can be formed by attaching two or more display devices 10.

In the display device 10, according to the arrangement shown in FIG. 1 to FIG. 20, the signal is received through the rear side of the signal line 120 and thus the size of the non-display area is reduced or removed entirely, and even though two display devices 10 are attached, a gap Gp between two display areas is narrow such that a user cannot recognize the gap Gp. In the present arrangement, as shown in FIG. 1, even though the connection portion 160 is formed on the non-display area, the width of each of the non-display is as narrow as several μm to several tens of μm such that the user cannot recognize the gap Gp between the two display areas even though the gap Gp is doubled. Therefore, when the large-scale display device is formed while attaching a display panel, a problem that a black colored stripe is viewed due to the non-display area in a portion where the display panel is attached can be solved.

While this disclosure has been described in connection with what is presently considered to be practical embodiments, it is to be understood that the invention is not necessarily limited to the disclosed embodiments. On the contrary, the present invention is intended to cover various modifications and equivalent arrangements included within the spirit and scope of the present disclosure.

What is claimed is:

1. A flexible display device, comprising:
a first flexible substrate including a signal line disposed on a first side of the first flexible substrate;
a second flexible substrate disposed on a second side of the first flexible substrate that is located opposite to the first side of the first flexible substrate;
an opening that penetrates both the first flexible substrate and the second flexible substrate;
a driver that is attached to the second flexible substrate; and
a connection portion that electrically connects the driver to the signal line through the opening,
wherein the first flexible substrate and the second flexible substrate are made of a same material.

2. The flexible display device of claim 1, further comprising an adhesive layer that attaches the second side of the first flexible substrate to a first side of the second flexible substrate.

3. The flexible display device of claim 2, wherein
the opening is continuous through the first flexible substrate, the adhesive layer, and the second flexible substrate.

4. The flexible display device of claim 3, further comprising a metal mask that is disposed on a second side of the second flexible substrate, and includes a metal mask opening that corresponds to the opening penetrating both the first flexible substrate and the second flexible substrate.

5. The flexible display device of claim 4, wherein
the opening penetrating both the first flexible substrate and the second flexible substrate exposes a rear side of the signal line, and
the connection portion is connected to the rear side of the signal line.

6. The flexible display device of claim 5, wherein
the connection portion contacts a second side of the metal mask.

7. The flexible display device of claim 5, wherein
a plurality of pixels is formed on the first side of the first flexible substrate, and the connection portion is connected to the signal line in a non-display area where the plurality of pixels is not located.

8. The flexible display device of claim 5, wherein
a plurality of pixels is formed on the first side of the first flexible substrate, and
the connection portion overlaps a display area where the plurality of pixels is disposed.

9. The flexible display device of claim 4, wherein
the signal line comprises a signal line opening, and the signal line opening overlaps the opening that penetrates both the first flexible substrate and the second flexible substrate.

10. The flexible display device of claim 9, further comprising an additional connection portion that is connected to the connection portion through the signal line opening, and
wherein the additional connection portion contacts the first side of the signal line.

11. The flexible display device of claim 2, wherein
the first flexible substrate includes two polyimide layers,
the second flexible substrate includes two inorganic insulating layers, and
the adhesive layer bonds the polyimide layer of the first flexible substrate to the polyimide layer of the second flexible substrate.

12. The flexible display device of claim 1, further comprising:
a plurality of pixels that is formed on the first side of the first flexible substrate;
an encapsulation layer covering the plurality of pixels;
a touch detector disposed on the encapsulation layer; and
a window disposed on the touch detector.

13. The flexible display device of claim 1, wherein the first flexible substrate and the second flexible substrate comprise a first display element and the flexible display device further includes a third flexible substrate and a fourth flexible substrate disposed on the third flexible substrate that comprise a second display element that is attached to the first display element.

14. A flexible display device, comprising:
a first flexible substrate including pixels formed on a first side of first flexible substrate;
a second flexible substrate disposed on a second side of the first flexible substrate that is located opposite to the first side of the first flexible substrate, wherein the first flexible substrate and the second flexible substrate are made of a same material and have a same thickness as measured in a direction from the first flexible substrate to the second flexible substrate that is normal to a plane of each of the first flexible substrate and the second flexible substrate;
an adhesive layer bonding the second side of the first flexible substrate and a first side of the second flexible substrate; and
an optical element that is disposed on a second side of the second flexible substrate,
wherein the optical element overlaps the first flexible substrate, the second flexible substrate, and the adhesive layer in a plan view.

15. The flexible display device of claim 14, wherein the optical element overlaps a display area within which the pixels are disposed.

16. The flexible display device of claim 15, wherein a light transmission area overlaps the optical element.

17. A method of manufacturing a flexible display device, comprising:
forming a signal line and pixels on a flexible substrate;
folding the flexible substrate with the signal line and pixels formed thereon;
bonding the folded flexible substrate using an adhesive layer to maintain the folded state; and
cutting a folded portion of the flexible substrate to divide it into a first flexible substrate where the signal line and the pixels are located, and a second flexible substrate located on a rear side of the first flexible substrate.

18. The method of claim 17, wherein
the forming of the signal line and the pixels on the flexible substrate further comprises forming a metal mask that includes an opening, and
the method further includes:
forming an opening that overlaps the signal line on the folded and attached flexible substrate using the metal mask as a mask; and
forming a connection portion that is connected to the signal line through the opening of the flexible substrate.

19. The method of claim 18, further comprising attaching a driver to the flexible substrate after the forming of the signal line and the pixels on the flexible substrate and before the folding of the flexible substrate.

20. The method of claim 17, further comprising attaching an optical element onto the flexible substrate after the forming of the signal line and the pixels on the flexible substrate and before the folding of the flexible substrate.

* * * * *